United States Patent
Ohmi et al.

(10) Patent No.: US 6,605,518 B1
(45) Date of Patent: Aug. 12, 2003

(54) METHOD OF SEPARATING COMPOSITE MEMBER AND PROCESS FOR PRODUCING THIN FILM

(75) Inventors: Kazuaki Ohmi, Yokohama (JP); Katsumi Nakagawa, Atsugi (JP); Nobuhiko Sato, Sagamihara (JP); Kiyofumi Sakaguchi, Yokohama (JP); Kazutaka Yanagita, Yokohama (JP); Takao Yonehara, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/558,657

(22) Filed: Apr. 26, 2000

(30) Foreign Application Priority Data

Apr. 30, 1999 (JP) .............................. 11-124744
Apr. 24, 2000 (JP) ........................ 2000-122569

(51) Int. Cl.⁷ .............................................. H01L 21/46
(52) U.S. Cl. .................... 438/458; 438/960; 438/406; 438/409
(58) Field of Search .............................. 438/458, 960, 438/406, 409, 762

(56) References Cited

U.S. PATENT DOCUMENTS

| | | | |
|---|---|---|---|
| 5,371,037 A | 12/1994 | Yonehara | 437/86 |
| 5,650,353 A * | 7/1997 | Yoshizawa et al. | 438/458 |
| 5,854,123 A | 12/1998 | Sato et al. | 438/507 |
| 5,856,229 A | 1/1999 | Sakaguchi et al. | 438/406 |
| 6,013,563 A * | 1/2000 | Henley et al. | 438/458 |
| 6,020,252 A * | 2/2000 | Aspar et al. | 438/458 |
| 6,054,363 A | 4/2000 | Sakaguchi et al. | 438/406 |
| 6,107,213 A * | 8/2000 | Tayanaka | 438/762 |

FOREIGN PATENT DOCUMENTS

| | | | |
|---|---|---|---|
| EP | 0867922 A2 * | 9/1998 | H01L/21/20 |
| JP | 5021338 | 1/1993 | |
| JP | 7302889 | 11/1995 | |

OTHER PUBLICATIONS

Sakaguchi, et al., "Eltran by Water–Jet Splitting in Stress–Controlled Porous Si", *1999 IEEE International SOI Conference*, Oct. 1999; pp. 110–111.

Ohmi, et al., "Water Jet Splitting of Thin Porous Si for ELTRAN", *1999 International Conference on Solid State Devices and Materials*; The Japan Society of Applied Physics, 1999; pp. 354–355.

* cited by examiner

*Primary Examiner*—Amir Zarabian
*Assistant Examiner*—Christy Novacek
(74) *Attorney, Agent, or Firm*—Fitzpatrick, Cella, Harper & Scinto

(57) ABSTRACT

To cause a crack at a fixed position in a separation layer, a method of separating a composite member includes the steps of forming a separation layer inside a composite member, forming inside the separation layer a stress riser layer in which an in-plane stress has concentratedly been produced to an extent that does not cause separation by the in-plane stress, and enlarging the in-plane stress to cause a crack in the stress riser layer, thereby separating the composite member.

2 Claims, 11 Drawing Sheets

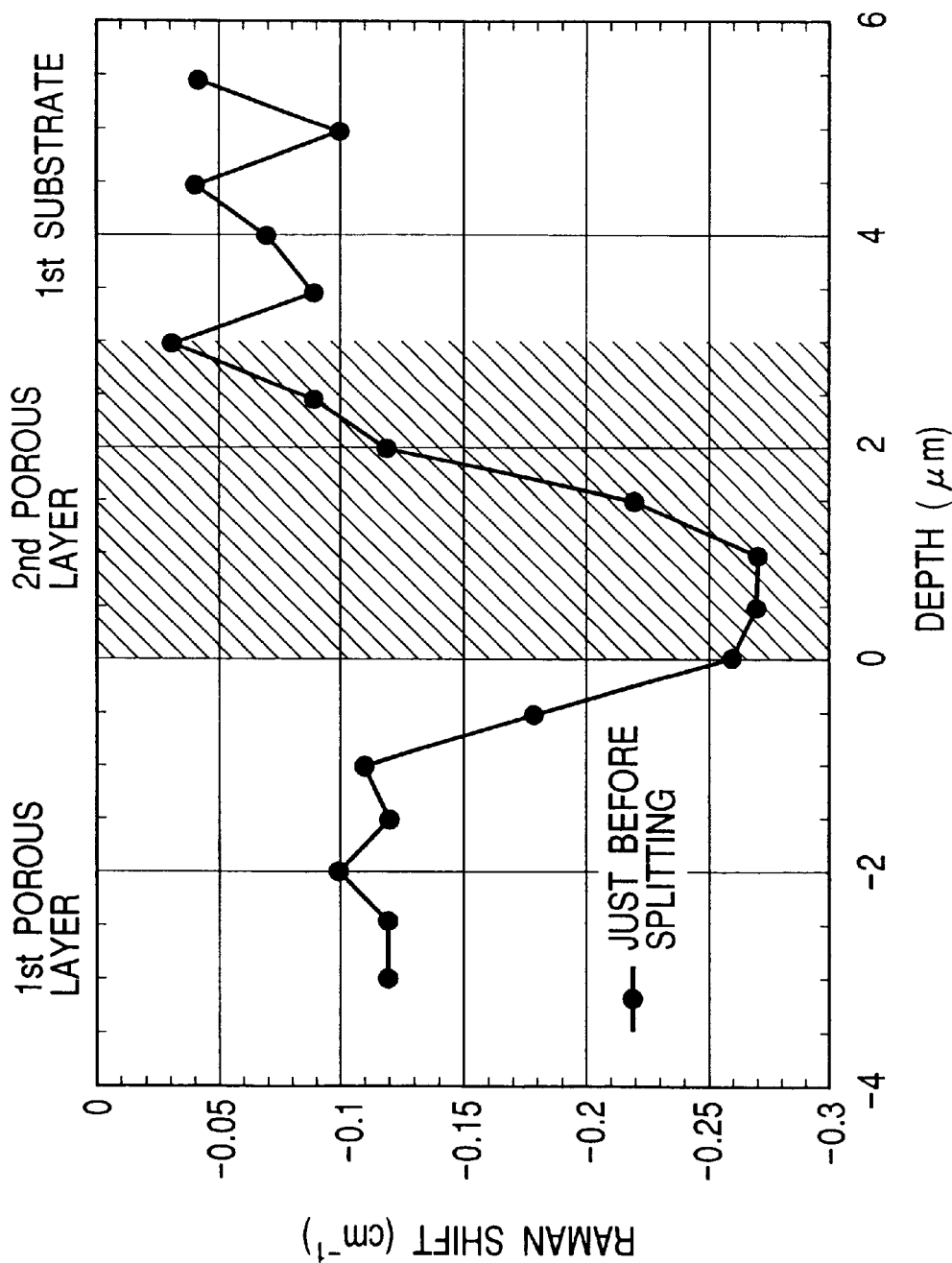

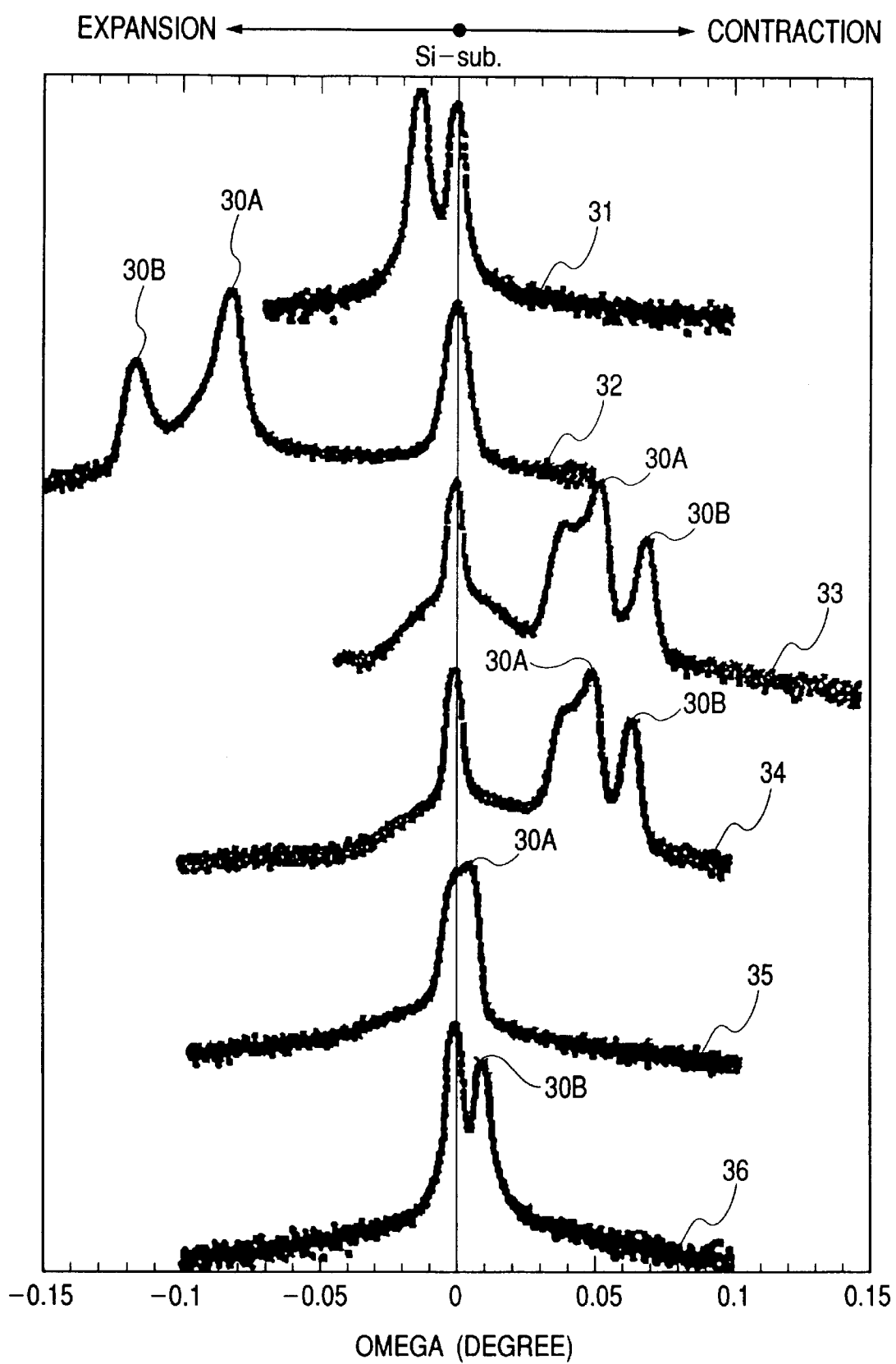

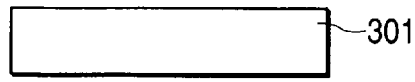
FIG. 13A
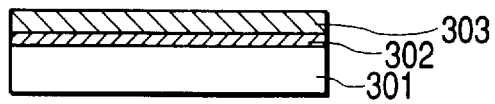
FIG. 13B
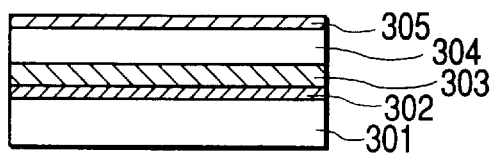
FIG. 13C
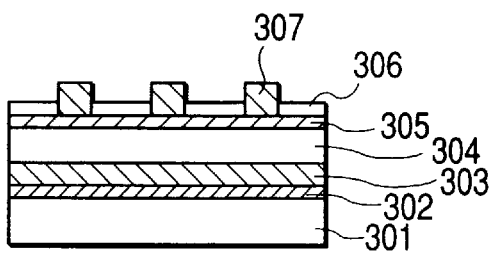
FIG. 13D
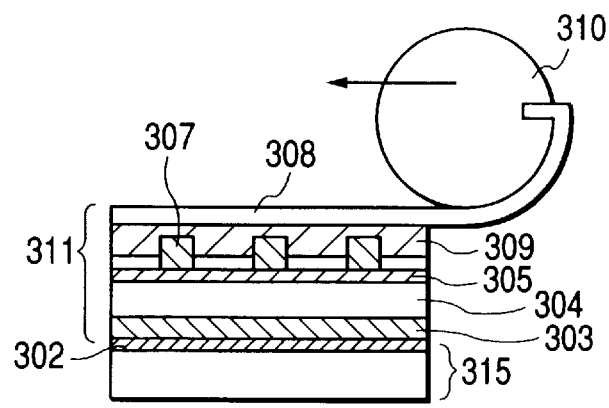
FIG. 13E
FIG. 13F
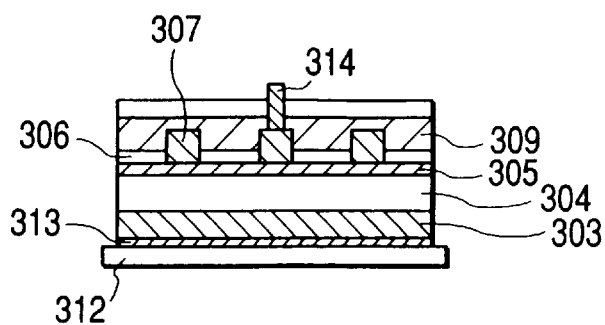
FIG. 13G

METHOD OF SEPARATING COMPOSITE MEMBER AND PROCESS FOR PRODUCING THIN FILM

BACKGROUND OF THE INVENTION

1. Field of the Invention

This invention relates to a method of separating (splitting) a composite member and a process for producing a thin film. Particularly, this invention belongs to a technical field of processes preferable for producing thin films used in solar cells and semiconductor wafers.

2. Related Background Art

Formation of single-crystal semiconductor layers on insulators is called SOI, i.e., silicon-on-insulator or semiconductor-on-insulator. A large number of researches have been made thereon because the devices utilizing the SOI technique have numerous superior points that can not be achieved by usual bulk silicon substrates on which silicon integrated circuits are to be fabricated. Specifically, the utilization of SOI technique brings about the following advantages, that is, the SOI technique is superior in, e.g., the following points.

(1) It enables high integration with easy separation of dielectrics.
(2) It promises a superior radiation resistance.
(3) Stray capacity can be reduced to enable high-speed performance.
(4) The well step can be omitted.
(5) Latch-up can be prevented.
(6) Fully depleted type electric-field effect transistors can be accomplished by thin-film formation.

Among processes for producing SOI silicon wafers, Japanese Patent Application Laid-open No. 5-21338 or U.S. Pat. No. 5,371,037 discloses a process for forming a non-single-crystal semiconductor layer on a porous layer and transferring this semiconductor layer to a supporting substrate via an insulating layer, which is very superior in view of the advantages such that SOI layers have good layer-thickness uniformity, the crystal defect density of SOI layers can be controlled to a low level with ease, SOI layers have a good surface smoothness, any specially designed expensive apparatus are not required in its production, and SOI having a layer thickness ranging widely from several nm to about 10 µm can be produced using the same apparatus.

The process disclosed in Japanese Patent Application Laid-open No. 7-302889 or U.S. Pat. No. 5,856,229 is a process for forming a non-porous single-crystal semiconductor layer on a porous layer formed on a first substrate, bonding the non-porous single-crystal layer to a second substrate, and thereafter separating the first substrate from the second substrate at the porous layer without breaking the first and second substrates. Then the surface of the first substrate is smoothed, and a porous layer is again formed thereon, whereby the first substrate can be reused a plurality of times. Thus, the production cost can greatly be reduced and also the production process itself can be simplified.

As methods of separating a composite member such as bonded substrates without breaking both the first substrate and the second substrate, available are a method of pulling the composite member in the direction perpendicular to the bonded surface, a method of applying a shear stress in parallel to the bonded surface (e.g., a method of moving the respective substrates in the direction opposite to each other at the plane parallel to the bonded surface, or a method of turning the respective substrates in the opposite directions), a method of applying a pressure in the direction perpendicular to the bonded surface, a method of applying a vibratory energy such as ultrasonic waves to the separation layer, a method of inserting a separating member (e.g., a sharp blade such as a knife) to the separation layer from the side surface of the bonded substrates (composite member) in parallel to the bonded surface, a method of utilizing an expansion energy of a substance made to soak into the porous layer that functions as a separation layer, a method of thermally oxidizing the porous layer that functions as a separation layer from the side surface of the composite member to cause the volume expansion of the porous layer, thereby separating the composite member, a method of selectively etching the porous layer that functions as a separation layer from the side surface of the bonded substrates (composite member) to separate the composite member, and a method of using a layer capable of producing microcavities which is formed by ion implantation as the separation layer and heating by irradiation with laser light to separate the composite member.

To describe specifically, the surface of a non-porous substrate such as a silicon wafer is anodized at two stages while changing the concentration of hydrofluoric acid of an anodizing solution or changing anodization currents to form a plurality of porous layers. The porous layers are subjected to heat treatment at 400° C. for 1 hour in a dry atmosphere of oxygen to form a silicon oxide layer of about 1 nm thick at the pore surfaces of the porous layers. On the layer surface of the porous layer, epitaxial growth is carried out by CVD (chemical vapor deposition) to form a non-porous layer. The surface of the non-porous layer is oxidized, and thereafter the non-porous layer is bonded to a silicon wafer prepared separately. To separate the resulting bonded wafers (composite member) into two parts, a wedge is inserted to the side surface of the bonded wafer, whereupon the porous layer having a relatively low mechanical strength is cracked to separate the bonded wafers.

In the separation of the composite member, however, if the separation layer has a high mechanical strength, the composite member tends to break before the composite member is completely separated. On the other hand, if the separation layer has a low mechanical strength, particles tend to occur.

Even if it has been able to form a separation layer having an appropriate mechanical strength, the separation layer may have no reproducibility for a position of the separation layer to be cracked when separated. In such a case, particles tend to occur, or conditions for the subsequent treatment of the separated member or thin films can not be uniformed, resulting in, e.g., an increase in production cost.

SUMMARY OF THE INVENTION

A first object of the present invention is to provide a method of separating (splitting) a composite member by which the separation layer can be cracked always at a fixed position, and a process for producing a thin film by such a method.

A second object of the present invention is to provide a method of separating a composite member by which the probability of break and the rate of occurrence of particles can be reduced and the conditions for treatment after separation can be set with ease, and a process for producing a thin film by such a method.

The present invention provides a method of separating a composite member, comprising the steps of;

forming a separation layer inside a composite member;

forming inside the separation layer a stress riser layer in which an in-plane stress is concentratedly generated to an extent that does not cause separation by itself; and enlarging the in-plane stress to crack the stress riser layer.

The present invention also provides a method of separating a composite member, comprising the steps of;

forming at the surface of a first substrate a porous layer having a thickness of at least 1 μm;

thereafter oxidizing pore inner-wall surfaces of the porous layer to form oxide films;

removing the oxide films formed at the pore inner-wall surfaces, in a depth of at least 1 μm from the layer surface of the porous layer so as to leave the oxide films at the lower part of the porous layer;

forming a non-porous layer on the surface of the porous layer;

bonding the non-porous layer to a second substrate to form a composite member having a separation layer internally; and causing a crack in the separation layer to separate the composite member.

The present invention still also provides a method of separating a composite member, comprising the steps of;

forming on the surface of a first substrate a first porous layer and a second porous layer having a higher porosity than that of the first porous layer;

oxidizing the second porous layer to make the second porous layer amorphous;

forming a non-porous layer on the layer surface of the first porous layer;

bonding the non-porous layer to a second substrate to form a composite member having a separation layer internally; and causing a crack in the separation layer to separate the composite member.

The present invention further provides a method of separating a composite member, comprising the steps of;

generating a temperature difference in a composite member having a separation layer internally; and causing a crack in the separation layer to separate to the composite member.

The present invention still further provides a method of separating a composite member, comprising the steps of;

preparing a composite member having a separation layer internally;

bending the composite member; and causing a crack in the separation layer to separate the composite member.

The present invention still further provides a process for producing a thin film by any one of the separation methods described above.

The present invention is based on a finding that, as long as a stress can be concentrated at a fixed position in the separation layer, the separation proceeds along the position where the stress has been concentrated. For example, layers containing microcavities, e.g., two porous layers having porosities different from each other are formed as the separation layer. Then, a predetermined in-plane stress is concentratedly generated at the interface between the two porous layers to form a stress riser layer (stress concentrated layer). Thereafter, a separation energy is externally applied in such a way that the in-plane stress increases until it exceeds the yield stress (a stress high enough for the separation layer to be cracked), whereupon a crack or a rupture is caused along the interface (i.e., at the stress riser layer in a higher porosity porous layer). Thus, the position to be cracked in the separation layer can be made stable, and hence the thickness of the remaining separation layer can be made always uniform and any unevenness of the exposed surface (separation surface) can be made to have been controlled. Accordingly, in the subsequent steps, various treatments can be made under the same treating conditions, so that the particles can be made to greatly less occur.

The separation method of the present invention, embodied in several ways, can provide a composite member separation method which locates a crack in a restricted portion of a separation layer, and a process for producing a thin film by such a method.

BRIEF DESCRIPTION OF THE DRAWINGS

FIG. 4 is a graph showing an example of a depth profile of the internal stress in the porous layers used in the present invention, measured by Raman spectroscopy.

FIGS. 5A and 5B are graphs showing examples of X-ray diffraction rocking curves of porous layers in the steps for the production of a thin film according to the present invention.

FIGS. 13A, 13B, 13C, 13D, 13E, 13F and 13G are schematic cross-sectional views illustrating a separation method and a thin-film production process according to the present invention.

DESCRIPTION OF THE PREFERRED EMBODIMENTS

Figure 1A:
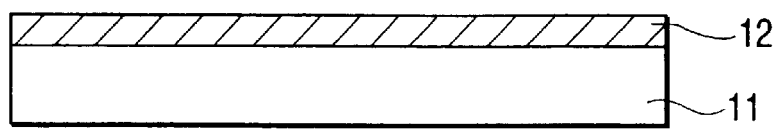
FIGS. 1A, 1B, 1C, 1D and 1E are schematic cross-sectional views illustrating a separation method and a thin-film production process according to the present invention.

The preferred embodiments of the present invention will be described below with referring to the drawings.

(Embodiment 1)

FIGS. 1A to 1E are schematic views showing a composite member separation method according to an embodiment of the present invention, and a thin-film production process that utilizes this method.

As shown in FIG. 1A, a first substrate 11 such as a silicon wafer is prepared, and a separation layer 12 such as a porous single-crystal silicon layer is formed on its surface.

Subsequently, the porous layer is processed in the manner as described later, to generate a stress concentratedly at a position intended to be cracked, whereby a stress riser layer 16 is formed.

Figure 1B:
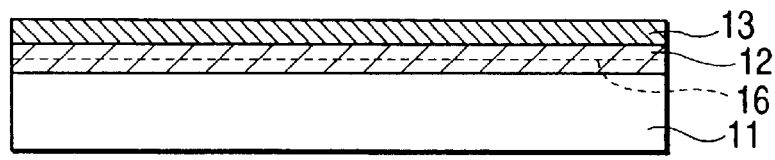

On the layer surface of the porous layer in which the in-plane stress has been generated, a non-porous layer (thin film) 13 such as a non-porous single-crystal silicon layer is formed (see FIG. 1B).

Figure 1C:
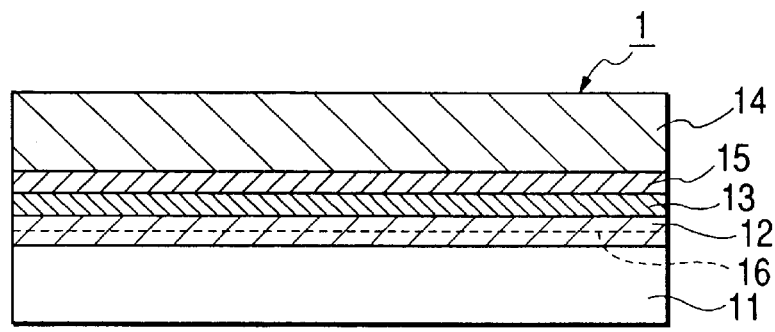
Figure 1D:
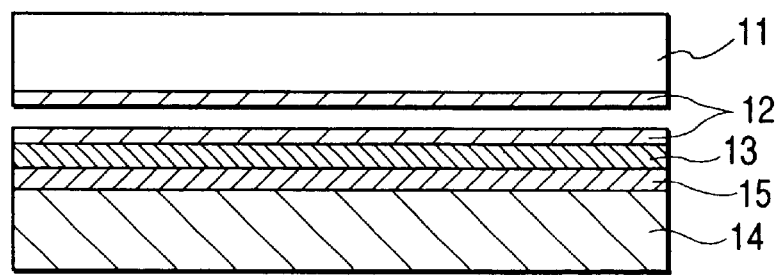

The non-porous layer 13 is bonded to a second substrate 14 such as a silicon wafer which is separately prepared, if necessary, with interposition of an insulating layer 15 such as a silicon oxide layer therebetween, to obtain a composite member 1 comprising a multi-layer structure, (see FIG. 1C).

A separation energy is externally applied to the multi-layer structure (composite member) 1 to enlarge the in-plane stress generated therein. This separation energy is an energy great enough to exceed the yield stress of the separation layer. Hence the separation layer is cracked at the position where the stress has concentratedly been generated, i.e., at the stress riser layer 16, so that the composite member is separated into two parts (see FIG. 1D).

Figure 1E:
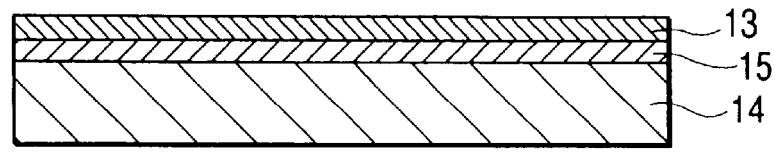

The non-porous layer 13 having been formed on the first substrate 11 is thus transferred onto the second substrate 14. FIG. 1E shows the state of the non-porous layer 13 after the remaining porous layer 12 has been removed.

In this way, the thin film, i.e., the non-porous layer 13 can be produced. This method does not care about materials for the substrate 14 that supports the non-porous layer 13. Accordingly, for example, this non-porous layer 13 on the insulating layer 15 can be used as an SOI layer.

The stress riser layer 16 may be formed using a layer showing X-ray diffraction peaks at least two of which deviate from a reference peak and have a distance of 0.01 degree or more therebetween.

Figure 2A:
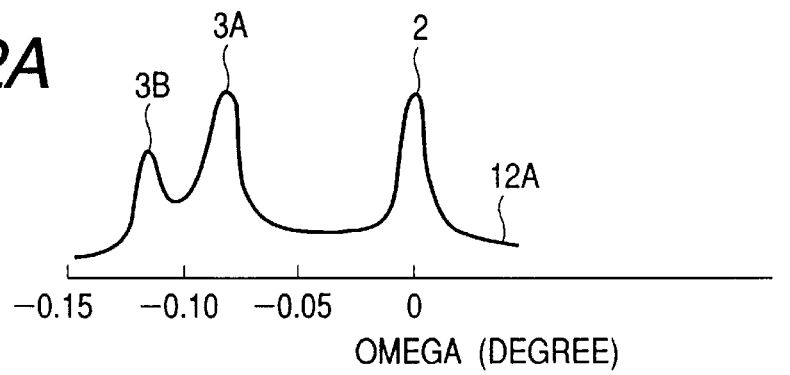
FIGS. 2A and 2B are graphs showing two X-ray diffraction rocking curves of substrates having the separation layer used in the present invention.
Figure 2B:
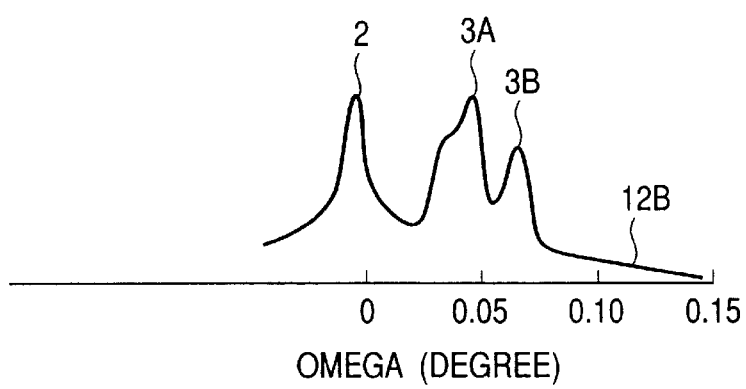

FIGS. 2A and 2B show typical examples of X-ray diffraction rocking curves of the separation layer 12 having the stress riser layer 16, used in the present invention.

Curve 12A is an X-ray diffraction rocking curve observed when two porous layers having porosities different from each other are formed and they are oxidized. Reference numeral 2 denotes a reference peak. Peaks 3A and 3B, which stands deviated from the reference peak 2, are a peak due to the low-porosity porous layer and a peak due to the high-porosity porous layer, respectively. The distance (difference in peak angles) between the peaks 3A and 3B can be controlled by controlling individually the porosity and thickness of each porous layer, the temperature and time in the oxidizing step and so forth.

Curve 12B is an X-ray diffraction rocking curve observed when two porous layers having porosities different from each other are formed and they are oxidized, followed by heat treatment at about 1,000° C.

Peaks 3A and 3B due to the respective porous layers stands deviated from a reference peak 2 in the positive direction.

In either cases, the porosity, thickness, oxidation conditions and heat treatment conditions for each porous layer may be controlled so that the distance between the peaks 3A and 3B come to be 0.01 degree or more.

In order to thus generate the stress concentratedly, the stress riser layer may be formed by any methods described below.

One of them is a method in which, after a porous layer having a thickness of at least 1 $\mu$m is formed, pore inner-wall surfaces of the porous layer are oxidized to form oxide films, and the oxide films formed on the pore inner-wall surfaces are removed in a depth of at least 1 $\mu$m from the layer surface of the porous layer so as to leave the oxide films only at the lower portion of the porous layer. Another is a method in which the oxide films formed at pore inner-wall surfaces of the porous layer are made to have a structure different in the thickness direction of the porous layer.

The significance of making stable the position to be cracked will be described here.

Figure 3A:
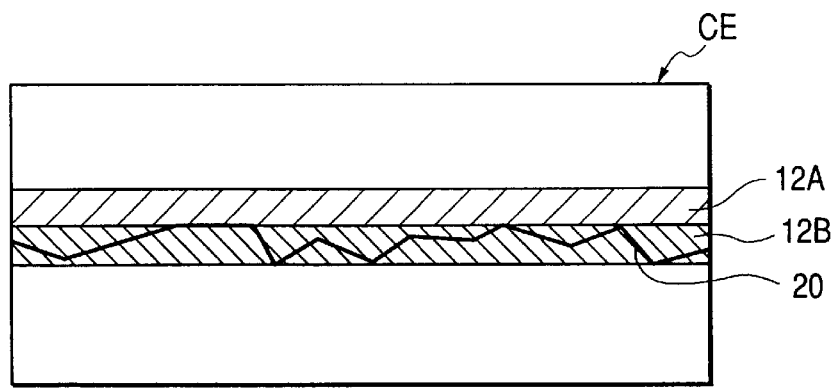
FIGS. 3A and 3B are schematic cross-sectional views showing the states of causing a crack in the separation layer.
Figure 3B:
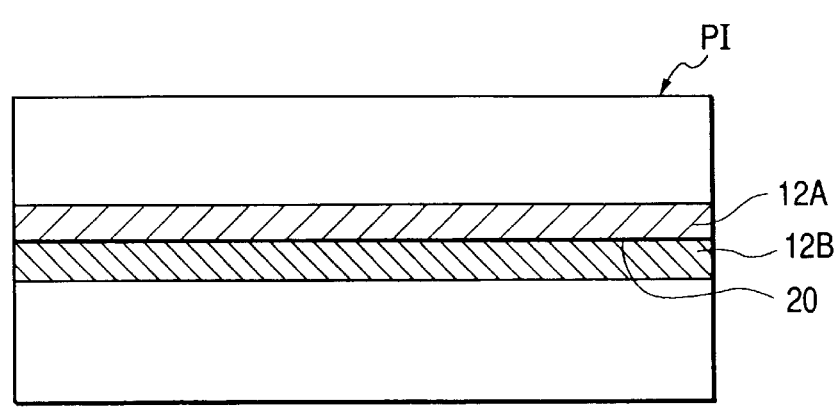

FIGS. 3A and 3B are schematic views showing, respectively, the state CE of the separation layer cracked when separated without generating the stress concentratedly, and the state PI of the separation layer cracked when separated after the stress has been generated concentratedly.

These figures show the states that the composite member having double-layered separation layer consisting of two layers which have mechanical strength different from each other is separated at the interface between the two layers.

In the case CE when the stress is not generated concentratedly, upon application of separation energy, the stress disperses in the second separation layer 12B having a relatively low mechanical strength, and a crack 20 runs through at random. Hence, the surface exposed after separation shows an unevenness with a difference in height corresponding to the layer thickness of the second separation layer 12B, and the separation layer breaks down at some part into particles.

On the other hand, in the case PI when the stress has concentratedly been generated to an extent that does not cause separation in the separation layer, a crack 20 runs through a restricted portion close to an interface between the first separation layer 12A and the second separation layer 12B when the stress is enlarged, and the both surfaces exposed after separation have flat surfaces.

Whether or not the stress stands concentrated in the separation layer can be ascertained by, e.g., known Raman spectroscopy to examine how the stress is generated between constituent atoms.

FIG. 4 shows results obtained when the stress distribution in a composite member having been treated to generate the stress concentratedly is measured from its cross section by Raman spectroscopy. The composite member as a sample used in this spectroscopy is a composite member obtained by anodizing a silicon wafer (first substrate) successively under two anodization conditions to form at its surface a porous silicon layer of double-layer structure, oxidizing pore inner-wall surfaces of the porous silicon layer, thereafter epitaxially growing a non-porous single-crystal silicon layer on the surface of the porous layer by CVD, forming an oxide film on the surface of the single-crystal silicon layer, and bonding the single-crystal silicon layer with the oxide film to another silicon wafer (second substrate) separately prepared.

On the abscissa in FIG. 4, when the interface between the first and second porous layers is regarded as a reference, the Raman shift observed at depths of from 2 $\mu$m to 5.5 $\mu$m shows a small change, where the stress between the second porous layer and the first substrate is seen to be small. On the other hand, the Raman shift observed at depths of from −3 $\mu$m to 1 $\mu$m is −0.27 cm$^{-1}$ to −0.26 cm$^{-1}$ in the second porous layer and −0.12 cm$^{-1}$ to −0.11 cm$^{-1}$ in the first porous layer. More specifically, the Raman shift differs by −0.14 to −0.16 cm$^{-1}$ at the interface between the low-porosity region (first porous layer) and the high-porosity region (second porous layer) and in the vicinity thereof, thus there is a difference of −0.1 cm$^{-1}$ or larger. As can be seen from this fact, the stress is generated concentratedly at this interface. Where the Raman spectroscopy has a higher resolution, the Raman shift at the depth of 0 μm would have become greater on the negative side. In this case, the thickness at the portion where the stress is concentrated in the second porous layer is about 1 μm, which is smaller than either thickness of the first and second porous layers.

Further detailed analysis has revealed that the stress in the interior of such a separation layer may vary depending on the steps for the production of a composite members.

FIG. 5A shows an example of measurement by X-ray diffraction which shows the state of varying the lattice space of a porous single-crystal layer in its (004)-plane direction in each step in a process for producing an SOI substrate in which porous single-crystal silicon having double-layer structure with different porosities is used as the separation layer. The peak at 0 degree is a peak due to (004)-plane non-porous single-crystal silicon (a reference peak). Such a variation corresponds to the stress acting in the interior of the porous single-crystal silicon.

Reference numeral 31 in FIG. 5A shows a curve immediately after the formation of the porous layer. The lattice strain in the porous single-crystal layer does not vary by only formation of the porous single-crystal silicon having double-layer structure with different porosities on the first substrate. This is because the peak around −0.01 to −0.02 degree is due to the porous single-crystal layer but the peak deviating from the reference peak is only that one.

Reference numeral 32 shows a curve immediately after thermal oxidation. Two peaks deviating from the reference peak stand appeared. Peak 30A is due to the first porous layer having a low porosity, and peak 30B is due to the second porous layer having a high porosity. It is seen that the thermal oxidation has brought about a difference in internal strain of the two layers. This difference causes the concentration of stress to the interface. In this case, tensile (expansion) stress is seen to be given.

The stress corresponding to the peak 30A is about −2.25×$10^9$ dyne/cm$^2$ (−2.25×$10^8$ Pa), and the stress corresponding to the peak 30B is about −3.44×$10^9$ dyne/cm$^2$ (−3.44×$10^8$ Pa).

Reference numeral 33 shows a curve immediately after epitaxial growth. Upon epitaxial growth of the non-porous single-crystal layer, the strain changes greatly to become compression (construction) stress. Since, however, the peaks 30A and 30B are present, the difference in lattice strain of the layers having different porosities are still present. This change is caused by the heating of the whole substrate at the time of epitaxial growth. Then, the stress corresponding to the peak 30A is about 1.42×$10^9$ dyne/cm$^2$ (1.42×$10^8$ Pa), and the stress corresponding to the peak 30B is about 2.05×$10^9$ dyne/cm$^2$ (2.05×$10^8$ Pa).

The cause of this has not completely be elucidated. It is presumed to be due to the fact that a porous layer having a larger surface area exhibits a greater change in either case.

Reference numeral 34 shows a curve immediately after the surface of the epitaxial layer has further been oxidized to form an oxide film. As can be seen from comparison with the peak of the curve 33, this strain has not changed so much. Peak 30A around 0.05 degree at this stage corresponds to the in-plane stress of 1.35×$10^9$ dyne/cm$^2$ (1.35×$10^8$ Pa). In the present invention, the in-plane stress at this stage should be made 1×$10^7$ dyne/cm$^2$ (1×$10^6$ Pa) or more.

The stress corresponding to the peak 30B changes to about 1.90×$10^9$ dyne/cm$^2$ (1.90×$10^8$ Pa).

Heat treatment further made at a temperature higher than the temperature set at the time of epitaxial growth or surface oxidation treatment of the epitaxial layer may cause a great change in stress to bring about a possibility that the above conditions are not fulfilled. Accordingly, after the oxidation of the epitaxial layer, it is preferable not to make heat treatment at 1,100° C. or higher any longer. It is more preferable not to make even heat treatment at 1,000° C. or higher any longer.

Reference numeral 35 shows a curve of the first porous layer on the side of the second silicon wafer immediately after the epitaxial layer with this oxide film has been bonded to the second silicon wafer prepared separately and the separation layer has been separated. The stress comes to be about 1.31×$10^8$ dyne/cm$^2$ (1.31×$10^7$ Pa).

Reference numeral 36 shows a curve of the second porous layer on the side of the first wafer immediately after the separation. The stress comes to be about 2.88×$10^8$ dyne/cm$^2$ (2.88×$10^7$ Pa).

It is seen that, after the separation, the strain of each porous layer is released and the shift of X-ray diffraction peaks become very smaller than that before the separation.

As can be seen from the foregoing, in the present invention, it is more preferable that a plurality of regions in which the amount of Raman spectroscopy peak shift in the interior of the separation layer of the present invention differs by at least −0.1 cm$^{-1}$ are formed in the separation layer.

It is also preferable that the range in which the stress is concentrated (i.e., the thickness of the stress riser layer) is set within the layer region of a layer thickness of 2 μm or smaller, more preferably 1 μm or smaller, and still more preferably 0.1 μm or smaller. This can be ascertained by measuring a ¼ width of the peak of the Raman spectroscopy peak shift.

The magnitude of in-plane stress is also known to be determinable by calculation from the amount of X-ray diffraction peak shift.

Where the plane distance in the direction perpendicular to the layer surface of the porous silicon layer is represented by dz, the plane distance in the direction perpendicular to the surface of the non-porous single-crystal silicon wafer by do, the diffraction angle (peak angle) of the porous silicon layer by θ$_1$, and the diffraction angle of the non-porous single-crystal silicon wafer by θ$_0$, the following equation (1) is satisfied.

$$dz=do[1-(θ_1-θ_0)/\tan θ_0] \quad (1)$$

Where the stress of the porous silicon layer is represented by σ, the Young's modulus of the porous silicon layer by E, the Poisson's ratio of the porous silicon layer by ν, and the in-plane lattice distance of the porous silicon layer by dxy, the following equation (1) is satisfied.

$$σ=E·[(dxy-dz)/\{2νdxy+(1-ν)dz\}] \quad (2)$$

Then, where the Young's modulus of the non-porous single-crystal silicon is used as E, setting dxy=do and ν=0.278−0.348 p (p is porosity), the stress σ is determinable from the diffraction angle θ$_1$ in the X-ray diffraction rocking curve.

Figure 5B:
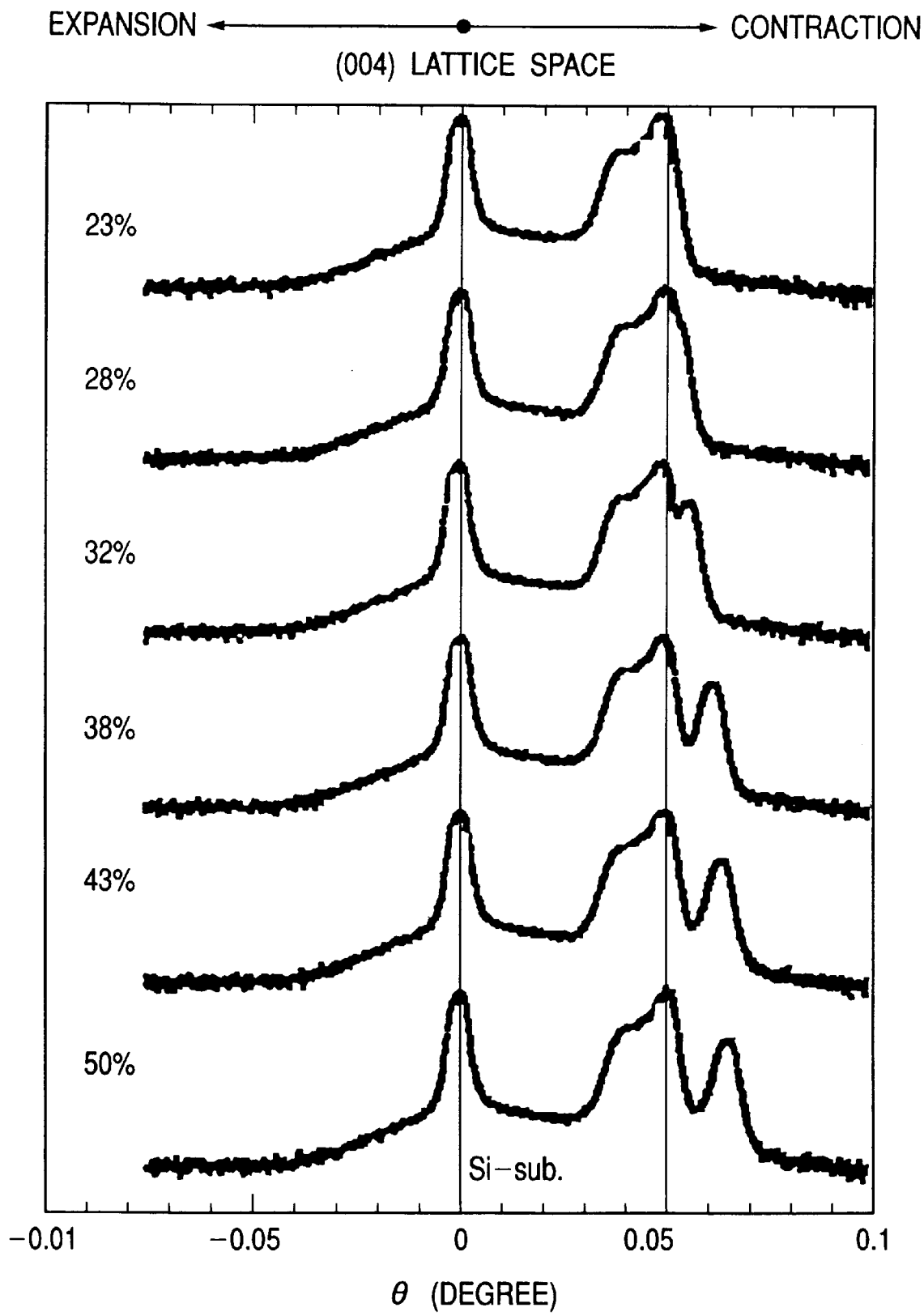

FIG. 5B shows X-ray diffraction rocking curves in six samples obtained by forming on the surface of a silicon wafer a first porous layer with a porosity of about 20%, thereafter forming a second porous layer with a different porosity, followed by low-temperature oxidation, thereafter forming a non-porous single-crystal silicon layer on the first porous layer, and oxidizing its surface.

It is seen that, depending on the porosity of the second porous layer, the stress of the second porous layer changes and the difference between the diffraction angle of the first porous layer and the diffraction angle of the second porous layer changes. It has also been found that the heat treatment made thereafter also causes changes in the difference in diffraction angles.

In the present invention, the difference in diffraction angles may preferably be set to be 0.01 degree or more, and more preferably from 0.01 degree to 0.02 degree, so as for the absolute value of difference in stress to become $4 \times 10^8$ dyne/cm$^2$ ($4 \times 10^7$ Pa) or more.

In addition, the porous layers obtained by forming a plurality of porous layers followed by thermal oxidation may each be so made as to have a stress of from $-1 \times 10^9$ to $-5 \times 10^9$ dyne/cm$^2$ (from $-1 \times 10^8$ to $-5 \times 10^8$ Pa).

Then, the plurality of porous layers after the non-porous layer has been formed on the uppermost porous layer may each be so made as to have a stress of $1 \times 10^9$ ($1 \times 10^8$ Pa) or more.

In order to enlarge the stress after it has been generated concentratedly, the same separation methods as those described in the prior art may be used. In particular, it is preferable to force apart the two substrates constituting the composite member by a wedge action of a solid or fluid so that the stress is enlarged to split the composite member. Besides this, usable are a method in which an expansion energy of a liquid or a substrate made to soak into the porous layer is utilized, and a method in which the porous layer is predominantly oxidized from the side face to cause the porous layer to undergo volume expansion to make separation.

Figure 6:
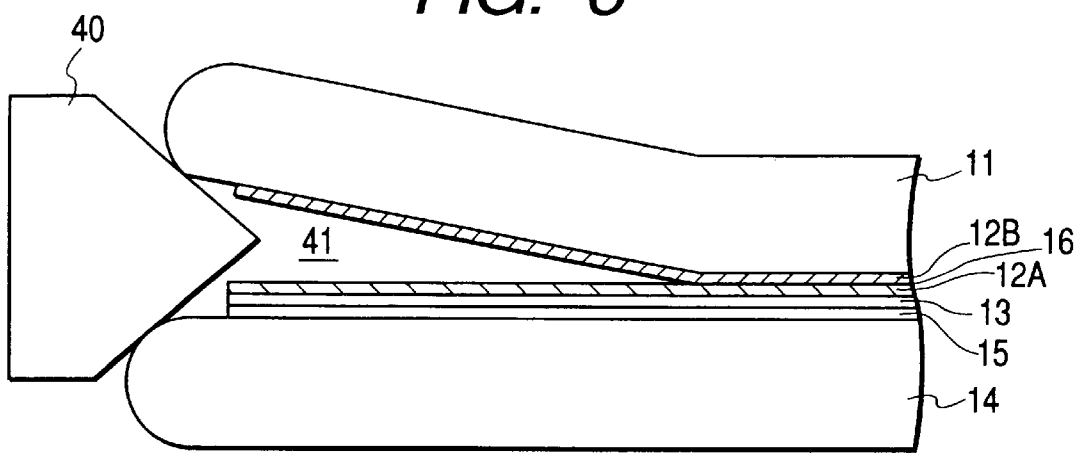
FIG. 6 is a schematic cross-sectional view showing an example of the separation method of the present invention.

FIG. 6 diagrammatically shows a state that a necessary external force is applied by a wedge to enlarge the in-plane stress to make separation.

Corners of the first and second substrates 11 and 14 may beforehand be beveled, and the side surfaces of the composite member is formed in a recessed shape on the inside. A wedge 40 as separation means made of metal or plastic may be inserted thereto, so that a force is applied in the direction the ends of the first and second substrates 11 and 14 come apart from each other. The in-plane stress having concentratedly been generated at the interface between the separation layers 12A and 12B is thereby enlarged. Once it exceeds the yield stress at the interface, a crack begins running, so that as shown in the drawing the first and second substrates becomes apart from each other at their ends. Soon after, the crack extends toward the middle of the composite member (toward the right direction of the drawing) along the stress riser layer 16, and finally the composite member is split into two parts. Actually, a crack extends in a restricted portion of the separation layer 12B close to the interface.

When a fluid wedge such as a liquid jet or a gas jet is used, the fluid enters also a gap 41 to act on wide areas, and hence the composite member can be separated in a very good yield and also while cleaning the separation surfaces. Also, a crack may be made to run as shown in FIG. 6 using a solid wedge, and thereafter the crack may be extended using a fluid wedge so that the composite member can completely be separated.

When the composite member is disklike, it is also preferable to insert a fluid wedge to its side surface while holding the composite member axially at the center and rotating it, to separate it from the periphery of the disk toward the center to make separation.

(Embodiment 2)

Without forming as the porous layer a plurality of porous layers having porosities different from each other, the manner of forming oxide films on the pore inner-wall surfaces of the porous layer may be devised so that the in-plane stress can be concentrated to the interior of the porous layer. FIGS. 7A to 7E are schematic cross-sectional views showing a state of one pore and its vicinity, which actually has a complicated shape, in order to explain formation of a separation layer according to the present embodiment.

Figure 7A:
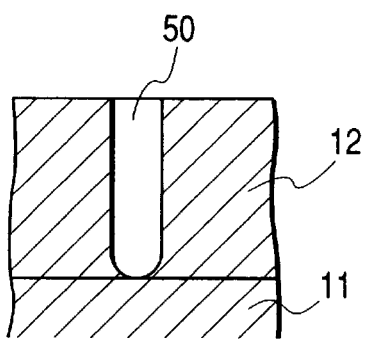
FIGS. 7A, 7B and 7C are schematic cross-sectional views showing separation layer formation steps used in the present invention.
Figure 7B:
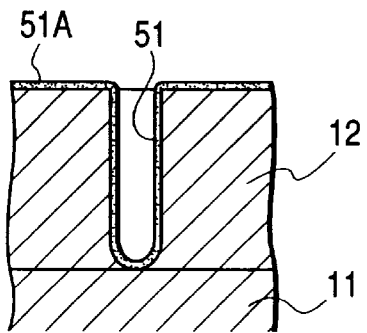
Figure 7C:
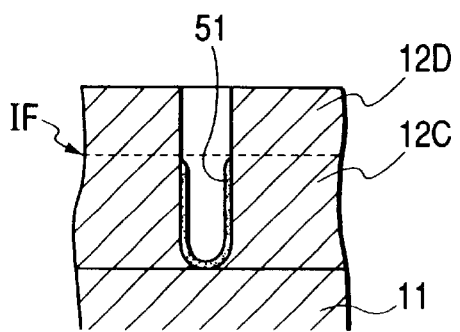

The surface of a substrate 11 is subjected to anodization under fixed conditions to form a single porous layer 12 with a thickness of at least 1 μm, and preferably at least 2 μm (see FIG. 7A). Thereafter, the porous layer is subjected to thermal oxidation to form an oxide film 51 on the inner-wall surfaces of a pore 50 (see FIG. 7B). Subsequently, the oxidized porous layer 12 is immersed in a solution containing hydrogen fluoride for a relatively long time to remove not only an oxide film 51A formed on the layer surface but also the oxide film 51 formed on the pore inner-wall surfaces lying beneath at a depth of at least 1 μm, and preferably at least 2 μm, from the layer surface. For example, where a porous layer 12 of 10 μm thick is formed, thereafter its pore inner-wall surfaces are oxidized and thereafter pore-wall oxide films 51 are removed to a position of 2 μm deep from the layer surface, thereby forming a porous semiconductor layer 12C of 8 μm thick having the oxide film on its pore inner-wall surface, and a porous semiconductor layer 12D of 2 μm thick having no oxide film on its pore inner-wall surface (see FIG. 7C).

Thereafter, if. necessary, heat treatment in a reducing atmosphere containing hydrogen (hydrogen baking) is conducted, and then epitaxial growth is carried out, so that the stress is concentratedly generated at the interface IF between the 8 micron thick porous semiconductor layer and the 2 micron thick porous semiconductor layer and in the vicinity thereof.

Figure 8:
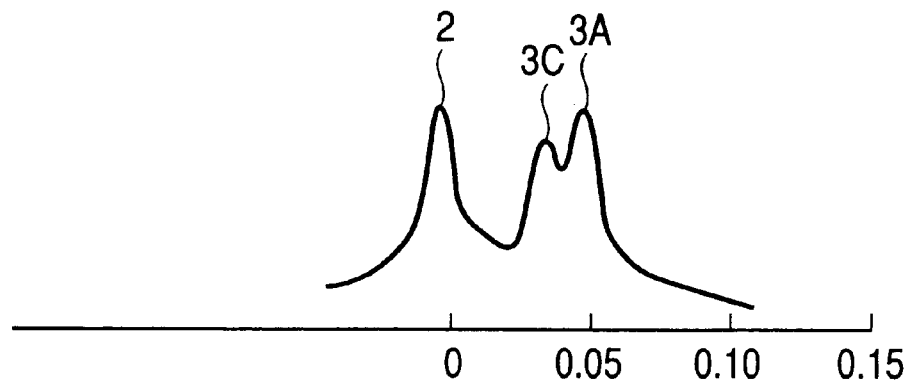
FIG. 8 is a graph showing an example of an X-ray diffraction rocking curve of a substrate having the separation layer used in the present invention.

In this case, the porosity and thickness of the porous layers 12C and 12D and the thickness of the oxide films of the pore inner-wall surfaces may be controlled so that as shown in FIG. 8 the X-ray diffraction rocking curve has two peaks 3A and 3C deviating from a reference peak 2 and the distance between them is 0.01 degree or more. Here, the peak 3C is due to the porous layer 12D from which the oxide films have been removed.

Thereafter, the bonding and then the separation are carried out in the same manner as in Embodiment 1, thus the composite member is cracked along the stress riser layer lying at the interface IF between the porous layer 12C and the porous layer 12D, whereby the composite member is separated to two parts.

In this way, a thin film comprising a non-porous single-crystal semiconductor is obtained on the substrate.

(Embodiment 3)

Figure 9A:
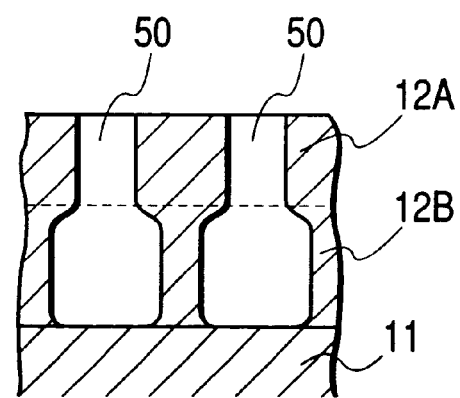
FIGS. 9A and 9B are schematic cross-sectional views showing other separation layer formation steps used in the present invention.
Figure 9B:
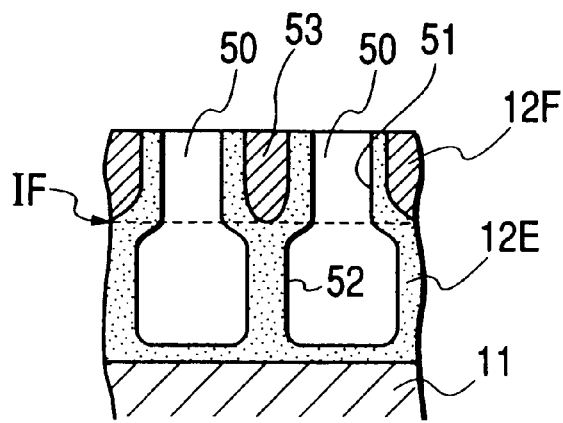

FIGS. 9A and 9B are schematic cross-sectional views showing two pores and their vicinity, which actually have much complicated shapes, in order to explain formation of a separation layer according to the present embodiment.

A low-porosity porous layer 12A and a high-porosity porous layer 12B are formed on the surface of a substrate 11 in the same manner as in Embodiment 1 (see FIG. 9A).

The porous layers are subjected to thermal oxidation until all the pore walls of the porous layer 12B turn into silicon oxide (amorphous body). Here, the pore walls of the low-porosity porous layer 12A have a thickness larger than the pore walls of the high-porosity porous layer 12B, and hence the insides 53 of pore walls remain as a single-crystal semiconductor. Thus, a porous layer 12F comprised of a porous single-crystal semiconductor having oxide films 51 on the pore inner-wall surfaces and a porous amorphous layer 12E are formed (see FIG. 9B).

Thereafter, in the same manner as in Embodiments 1 and 2, the non-porous single-crystal semiconductor layer is formed by epitaxial growth and the bonding and then the separation are carried out. Since a stress riser layer is formed at the interface IF between the porous layers 12E and 12F, the composite member is cracked along this interface to be separated to two parts.

In this way, a thin film comprising a non-porous single-crystal semiconductor is obtained on the substrate.

Thus, the method may be used in which the oxide films to be formed on the pore inner-wall surfaces of a porous layer are made to have a structure different in the layer thickness direction of the porous layers, in particular, the method in which the porous layer is formed as a plurality of layers having different porosities and, when they are oxidized, subjected to high-temperature oxidation or long-time oxidation. This brings the porous layer into a state where the layer having a high porosity is oxidized in substantially the whole layer to turn amorphous and on the other hand the layer having a low porosity is oxidized on its pore inner-wall surfaces but their inner pore walls themselves are kept single-crystallinity. That is, the layer having a low porosity becomes a porous single-crystal semiconductor layer having oxide films and the layer having a high porosity becomes a porous amorphous insulating layer.

Thus, in the case when the oxide films in the porous layers differ in structure, a very great strain can be generated between the two layers, and hence the separation can be made with ease. This means that, when a porous layer having too low a porosity to enable separation does not the concentrated stress, according to the present invention it is possible to cause a crack even in the porous layer.

(Embodiment 4)

The present embodiment involves the step of generating a stress concentratedly after a composite member has been produced. Steps other than this step correspond to those in Embodiments 1 to 3.

FIGS. 10A to 10D are schematic views for explaining a separation method according to the present embodiment.

Figure 10A:
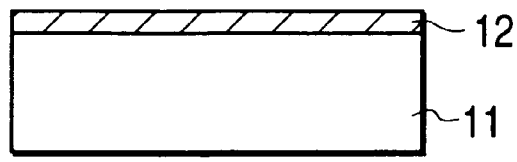
FIGS. 10A, 10B, 10C and 10D are schematic cross-sectional views showing a composite member separation method according to the present invention.

First, a first substrate 11 such as a silicon wafer is prepared, and a separation layer 12 such as a porous single-crystal silicon layer is formed on its surface (see FIG. 10A).

Figure 10B:
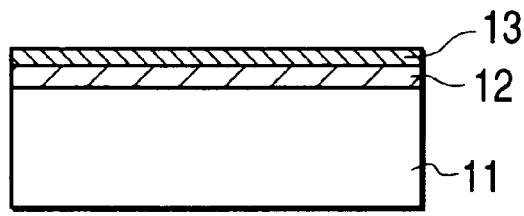

On the layer surface of the separation layer 12, a non-porous layer (thin film) 13 such as a non-porous single-crystal silicon layer is formed (see FIG. 10B).

Figure 10C:
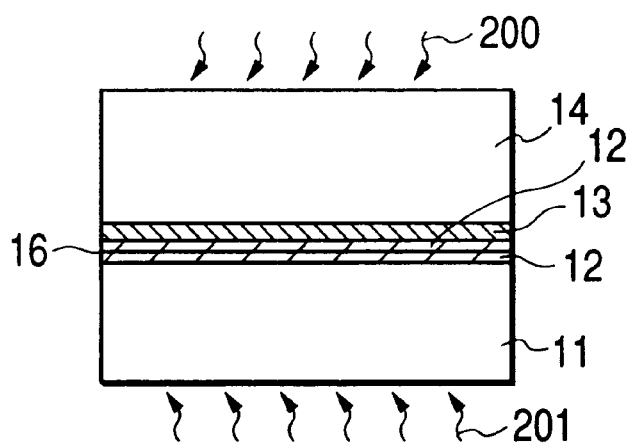

The non-porous layer 13 is bonded to a second substrate 14 separately prepared to obtain a composite member comprising a multi-layer structure (see FIG. 10C). This composite member is treated to generate a stress concentratedly. In this instance, in-plane stress may concentratedly be generated by, e.g., a method in which the first and second substrates 11 and 14 constituting the composite member are heated and/or cooled so as to have temperatures different from each other to generate a temperature difference between layer regions on the upper and lower sides of the separation layer. FIG. 10C shows a state that the substrate 11 is heated by heating 201 and the substrate 14 is cooled by cooling 200.

Figure 10D:
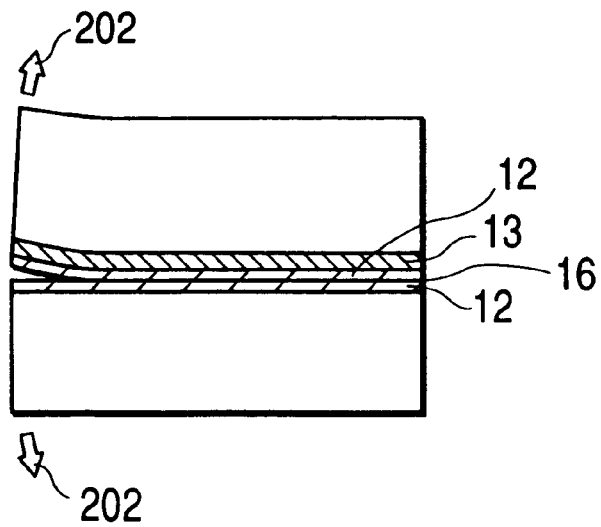

Then, a separation energy 202 is externally applied to the multi-layer structure (composite member) to enlarge the in-plane stress having been generated. This separation energy is an energy great enough to exceed the yield stress of the separation layer. Hence the composite member is cracked at a stress riser layer 16 lying at the position where the stress has concentratedly been generated, to become separated into two parts (FIG. 10D).

The non-porous layer 13 having been formed on the first substrate 11 is thus transferred onto the second substrate 14.

In an instance where the composite member is separated without generating the stress concentratedly, the strength of the separation layer must be controlled at a high precision. If the separation layer has too high a mechanical strength, the substrate may break or a break may take place at a portion(s) other than the separation layer. Also, if the separation layer is formed in too low a mechanical strength, a separation region may break before the bonding. In such a case, the separation layer may partly break in the step of forming the separation layer by anodization or ion implantation or in the subsequent steps of heating, oxidation and epitaxial growth, thereby making it impossible to carry out the bonding or resulting in contamination of processing assemblies with particles.

Conventionally, a porous layer is used when a composite member is so separated as to be cracked at a separation layer, and its porosity is made higher to lower mechanical strength at that part to make the separation easy. Lowering mechanical strength to make the separation easy, however, may cause a break of the porous layer even in steps before the separation. Even if any break does not occur before the separation step, cracks may occur and run at various positions in the porous layer at the time of separation to make separation surfaces greatly uneven. Such unevenness can be a great obstacle in practical use in some uses to which such a method is applied.

When the present invention is applied in the manufacture of SOI substrates, it is necessary for the porous layer to have a layer thickness distribution as uniform as possible after separation. For this purpose, a method is also available in which the porous layer is formed in multi-layer structure consisting of several layers having different porosities so that only a layer having the highest porosity among them and therefore having the lowest mechanical strength can be cracked. In such a method, however, in order to cause cracks only in the high-porosity layer to achieve a smoothness of the separation surface, the thickness of that layer must be made very small. However, it is not easy to form a separation layer which is thin and has a good in-plane uniformity.

In the case of the present embodiment, the porous layer may have a uniform porosity, but the use of a plurality of layers having porosities different from each other makes it possible to more surely concentrate the stress at their interface and in the vicinity thereof.

With regard to other steps, constituent materials of the composite member, the values of stress and so forth, the same as those in Embodiment 1 are applicable.

(Embodiment 5)

The present embodiment involves the step of producing a stress concentratedly after a composite member has been produced. Steps other than this step correspond to those in Embodiments 1 to 3.

FIGS. 11A to 11D are schematic views for illustrating a separation method according to the present embodiment.

Figure 11A:
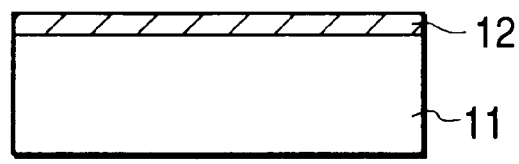
FIGS. 11A, 11B, 11C and 11D are schematic cross-sectional views showing another method of separating a composite member according to the present invention.

First, a first substrate 11 such as a silicon wafer is prepared, and a separation layer 12 such as a porous single-crystal silicon layer is formed on its surface (see FIG. 11A).

Figure 11B:
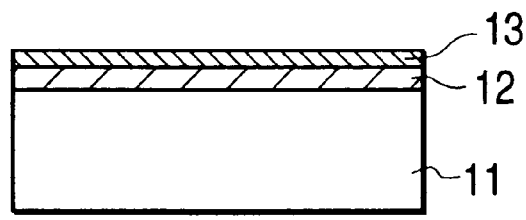

On the layer surface of the separation layer 12, a non-porous layer (thin film) 13 such as a non-porous single-crystal silicon layer is formed (see FIG. 11B).

Figure 11C:
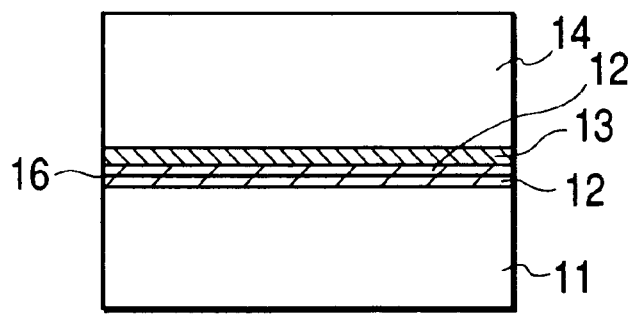

The non-porous layer 13 is bonded to a second substrate 14 separately prepared to obtain a composite member having a multi-layer structure (see FIG. 11C). This composite member is treated to generate a stress concentratedly. For example, a temperature difference is generated between the separation layer and the first and/or second substrates constituting the composite member.

Figure 11D:
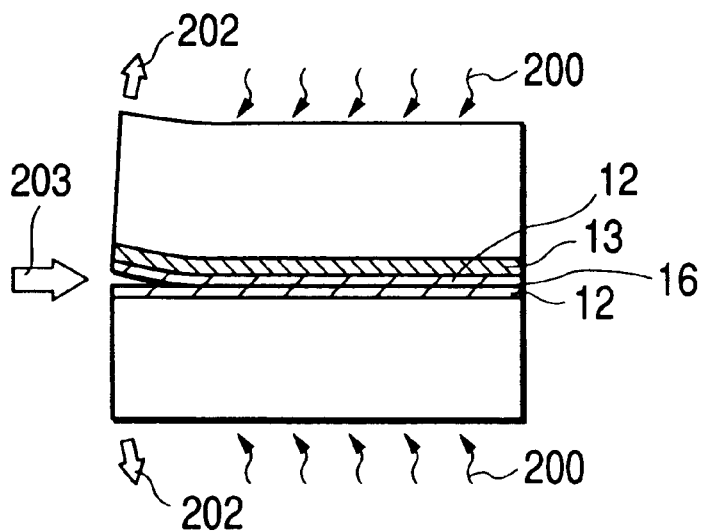

As shown in FIG. 11D, a heated fluid 203 is externally jetted to the side surface of the multi-layer structure while cooling the both substrates 11 and 14, so as to apply a separating energy 202 like the case shown in FIG. 10. The in-plane stress having been generated is enlarged. This separating energy is an energy great enough to exceed the yield stress of the separation layer. Hence the composite member is cracked at a stress riser layer 16 lying at the position where the stress has concentratedly been generated, to become separated into two parts.

The non-porous layer 13 having been formed on the first substrate 11 is thus transferred onto the second substrate 14.

In the case of the present embodiment, the porous layer may have a uniform porosity, but the use of a plurality of layers having porosities different from each other makes it possible to more surely concentrate the stress at their interface and in the vicinity thereof.

With regard to other steps, constituent materials of the composite member, the values of stress and so forth, the same as those in Embodiment 1 are applicable.

(Embodiment 6)

The present embodiment involves the step of producing a stress concentratedly after a composite member has been produced. Steps other than this step correspond to those in Embodiments 1 to 3.

FIGS. 12A to 12D are schematic views for illustrating a separation method according to the present embodiment.

Figure 12A:
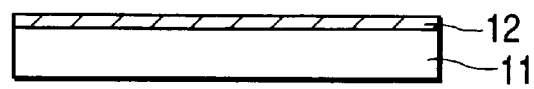
FIGS. 12A, 12B, 12C and 12D are schematic cross-sectional views showing still another method of separating a composite member according to the present invention.

First, a first substrate 11 such as a silicon wafer is prepared, and a separation layer 12 such as a porous single-crystal silicon layer is formed on its surface (see FIG. 12A).

Figure 12B:
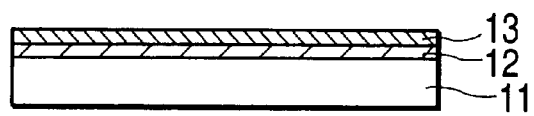

On the layer surface of the separation layer 12, a non-porous layer (thin film) 13 such as a non-porous single-crystal silicon layer is formed (see FIG. 12B).

Figure 12C:
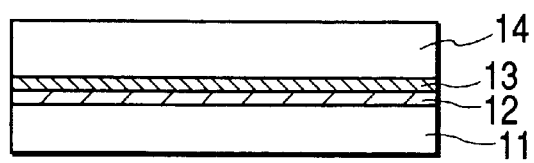

The non-porous layer 13 is bonded to a second substrate 14 separately prepared to obtain a composite member having a multi-layer structure (see FIG. 12C). This composite member is bent to generate a stress concentratedly.

A fluid 203 is externally jetted to the side surface of the multi-layer structure to apply a separating energy 202 to enlarge the in-plane stress having been generated. This separating energy 202 is an energy great enough to exceed the yield stress of the separation layer. Hence the composite member is cracked at a stress riser layer 16 lying at the position where the stress has concentratedly been generated, to become separated into two parts (see FIG. 12D).

Figure 12D:
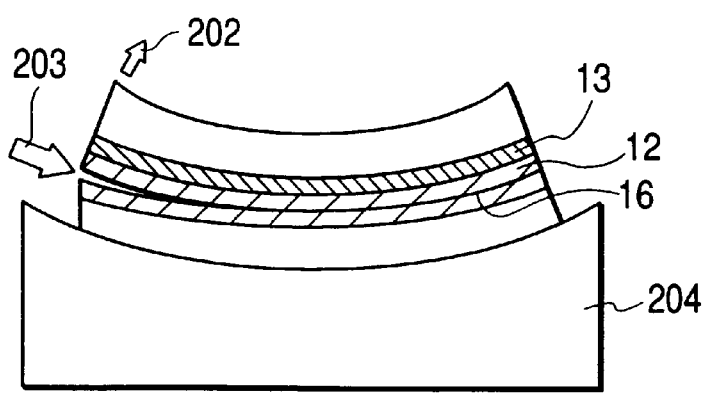

As shown in FIG. 12D, the composite member is bent while holding it on a supporting stand having a concave surface. Alternatively, the composite member may be bent while suction-attracting it to a supporting stand having an opening.

The non-porous layer 13 having been formed on the first substrate 11 is thus transferred onto the second substrate 14.

In the case of the present embodiment, the porous layer may have a uniform porosity, but the use of a plurality of layers having porosities different from each other makes it possible to more surely concentrate the stress at their interface and in the vicinity thereof.

With regard to other steps, constituent materials of the composite member, the values of stress and so forth, the same as those in Embodiment 1 are applicable.

As the first substrate 11 used in the present invention, preferably used are, in addition to the silicon wafer as described above, wafers of semiconductors such as silicon-germanium, gallium arsenide, and gallium aluminum arsenide.

As the separation layer 12 used in the present invention, preferably used are layers having microcavities, stated specifically, porous layers having closed cells and/or open cells. The porous layer may also be formed by implanting ions of inert gas or the like to a wafer to make heat treatment. Preferably it may be formed by anodization to make a non-porous semiconductor wafer porous.

As described previously, the porous layer may be a single layer. It is also preferable to form a plurality of layers having porosities different from each other, by changing anodization conditions. Here, the layers formed in plurality may more preferably be made to have thicknesses different from each other. To change the porosity, a preferred method is to change EF (hydrogen fluoride) concentration in an anodizing solution, or to change electric currents to be flowed. Also, an ion-implanted layer may be used as the separation layer, and at least two layers having different ion quantities may be formed to utilize the stress that concentrates to their interface.

As the non-porous layer 13 used in the present invention, it may be any intended thin film without any particular limitations. Where it is intended for the formation of semiconductor devices, it may be a single layer or a plurality of layers of a semiconductor such as silicon, silicon germanium, silicon carbide, germanium, gallium arsenide or gallium aluminum arsenide. Where it is intended for thin films used as SOI layers, single crystals formed by gas-phase, liquid-phase or solid-phase epitaxial growth are used. Also, if necessary, an insulating layer may be formed on the surface of the non-porous layer.

As the second substrate 14 used in the present invention, it may be the same substrate as the first substrate 11, or may be a sheetlike or disklike elastic or non-elastic material such as glass, quartz glass, resin or metal.

The present invention will be described below in greater detail by giving Examples.

EXAMPLE 1

A p-type first single-crystal silicon wafer with a resistivity of 0.01 $\Omega$·cm was subjected to two-stage anodization in an HF solution to form a double-layer porous layer. Anodization conditions were as follows:

First Stage
Current density: 7 mA·cm$^{-2}$
Anodizing solution: HF:H$_2$O:C$_2$H$_5$OH=1:1:1
Time: 5 minutes
Thickness of first porous silicon layer: 4.5 $\mu$m
Second Stage
Current density: 30 mA·cm$^{-2}$
Anodizing solution: HF:H$_2$O:C$_2$H$_5$OH=1:1:1
Time: 10 seconds
Thickness of second porous silicon layer: 0.2 $\mu$m The wafer having the porous layers was subjected to thermal oxidation treatment at 600° C. for 2 hours in an atmosphere of oxygen. As a result of this oxidation, the pore inner-wall surfaces of porous silicon were covered with thermal oxide films. The surface of this porous silicon layer was treated with hydrofluoric acid to remove only the oxide films of the pore inner-wall surfaces of the porous silicon layer, to a depth of about 2 microns from the surface of the porous layer, and to leave oxide films of pore inner-wall surfaces in the region deeper than the depth of about 2 microns. Thereafter, the resultant wafer was transported into a CVD reactor.

The temperature of the wafer was raised to 950° C., followed by prebaking to make heat treatment while flowing only hydrogen gas before sources gases are flowed, to seal pores present on the layer surface of the porous layer.

Then, single-crystal silicon was epitaxially grown on the porous layer by CVD in a thickness of 0.3 $\mu$m. Growth conditions were as follows:

Source gases: $SiH_2Cl_2/H_2$
Gas flow rate: 0.5/180 l/min.
Gas pressure: 80 Torr (about $1.06 \times 10^4$ Pa)
Temperature: 950° C.
Growth rate: 0.3 µm/min.

The surface of the single-crystal silicon layer thus epitaxially grown was subjected to thermal oxidation to further form a silicon oxide film of 100 nm thick as an insulating layer. The X-ray diffraction rocking curve of the sample obtained through the steps up to this stage had peaks 3A and 3B in the curve 12B in FIG. 2B and the peak 3C in FIG. 8 in combination.

The surface of the silicon oxide film and the surface of a second silicon wafer separately prepared were face to face brought into contact, followed by heat treatment at 1,100° C. for 60 minutes to effect bonding.

To the composite member thus obtained, a wedge was inserted from its side surface, whereupon it was separated flatly in an unevenness of about 300 nm by rupture formed in the porous layer having a high porosity at the vicinity of the interface between the porous layer having a high porosity and the porous layer having a low porosity. Since the separation surfaces of the wafers thus separated were covered with porous layers, the single-crystal silicon layer was protected from the flaws to be caused by the wedge.

As the result, the $SiO_2$ layer, the epitaxial silicon layer, the porous layer with a low porosity and a part of the porous silicon layer with a high porosity which were originally formed on the first silicon wafer surface were transferred to the second wafer side. On the first wafer, only the porous silicon layer with a high porosity remained.

Thereafter, the porous silicon layer transferred onto the second wafer was selectively etched with a mixture solution of hydrofluoric acid containing an HF concentration of 49% by weight, hydrogen peroxide water with an $H_2O_2$ concentration of 30% by weight and water; the solution being used with stirring.

Thus, a single-crystal silicon thin film having a thickness of 0.2 µm was formable on the silicon oxide film.

The layer thickness of the single-crystal silicon layer thus formed was measured at 100 spots over the in-plane whole area to find that the layer thickness was in a uniformity of 201 nm±3 nm As a result of cross-sectional observation with a transmission electron microscope, any new crystal defects were not brought into the silicon layer, and good crystallinity was maintained.

The silicon layer (thin film) was further subjected to heat treatment at 1,100° C. in an atmosphere of hydrogen at atmospheric pressure to make surface-smoothing treatment. Its surface roughness was examined with an atomic force microscope to find that the average square roughness in regions of 50 µm square was 0.2 nm, which was equal to that of usually commercially available silicon wafers.

The porous silicon remaining on the first wafer side was thereafter removed by selective etching with a mixture solution of hydrofluoric acid with an HF concentration of 49% by weight, hydrogen peroxide water with an $H_2O_2$ concentration of 30% by weight and water; the solution being used with stirring.

The resultant first wafer may thereafter be subjected to hydrogen annealing or surface treatment such as surface polishing, thus it can be used again as the first wafer or as the second wafer.

EXAMPLE 2

A p-type first single-crystal silicon wafer with a resistivity of 0.01 Ω·cm was subjected to anodization in an HF solution. Anodization conditions were as follows:

Current density: 7 mA·cm$^{-2}$
Anodizing solution: $HF:H_2O:C_2H_5OH=1:1:1$
Time: 11 minutes
Thickness of porous silicon layer: 12 µm The wafer thus treated was oxidized at 400° C. for 1 hour in an atmosphere of oxygen, and thereafter further wet-oxidized at 800° C. for 10 minutes. As a result of this oxidation, the pore inner-wall surfaces of porous silicon were covered with thermal oxide films. The surface of this porous silicon layer was treated with hydrofluoric acid to remove only the oxide films of the pore inner-wall surfaces of the porous silicon layer, to a depth of about 2 microns from the surface of the porous layer. Thus, only oxide films of pore inner-wall surfaces at a part deeper than 2 microns were left.

After hydrogen baking was carried out, single-crystal silicon was epitaxially grown on the porous silicon by CVD in a thickness of 0.3 µm. Growth conditions were as follows:

Source gases: $SiH_2Cl_2/H_2$
Gas flow rate: 0.5/180 l/min.
Gas pressure: 80 Torr (about $1.06 \times 10^4$ Pa)
Temperature: 950° C.
Growth rate: 0.3 µm/min.

The surface of this epitaxial silicon layer was subjected to thermal oxidation to further form a silicon oxide film of 200 nm thick as an insulating layer. The X-ray diffraction rocking curve of the sample obtained through the steps up to this stage had the same peaks as those shown in FIG. 8.

The surface of the silicon oxide film and the surface of a second silicon wafer separately prepared were face to face brought into contact, followed by heat treatment at 1,100° C. for 60 minutes to effect bonding.

The bonded substrate (composite member) thus obtained was separated by water jetting, whereupon it was separated very smoothly at the interface between the region where the oxide films of the pore inner-wall surfaces were removed and the region where the oxide films were left.

As the result, the silicon oxide film, the epitaxial silicon layer and a part of the porous silicon layer which were originally formed on the first silicon wafer surface were transferred to the second wafer side. On the first wafer, only the porous silicon remained.

Thereafter, the porous silicon layer transferred onto the second wafer was selectively etched with a mixture solution of hydrofluoric acid with an HF concentration of 49% by weight, hydrogen peroxide water with an $H_2O_2$ concentration of 30% by weight and water; the solution being used with stirring. The single-crystal silicon remained without being etched.

Thus, a thin film comprising single-crystal silicon having a thickness of 0.2 µm was formable on the silicon oxide film.

The thin film was further subjected to heat treatment at 1,100° C. in an atmosphere of hydrogen.

EXAMPLE 3

A p-type first single-crystal silicon wafer with a resistivity of 0.01 Ω·cm was subjected to two-stage anodization in an HF solution to form a double-layered porous layer. Anodization conditions were as follows:

First Stage
Current density: 7 mA·cm$^{-2}$
Anodizing solution: $HF:H_2O:C_2H_5OH=1:1:1$
Time: 5 minutes
Thickness of first porous silicon layer: 4.5 µm
Second Stage
Current density: 30 mA·cm$^{-2}$
Anodizing solution: $HF:H_2O:C_2H_5OH=1:1:1$ Time: 10 seconds
Thickness of second porous silicon layer: 0.2 μm The substrate thus treated was subjected to hydrogen baking of its porous silicon layer without thermal oxidation of pore inner-wall surfaces of the porous silicon. Thereafter, single-crystal silicon was epitaxially grown on the porous layer by CVD in a thickness of 0.3 μm. Growth conditions were as follows:
Source gases: $SiH_2Cl_2/H_2$
Gas flow rate: 0.5/180 l/min.
Gas pressure: 80 Torr (about $1.06 \times 10^4$ Pa)
Temperature: 950° C.
Growth rate: 0.3 μm/min.

On the layer surface of this epitaxial silicon layer, a silicon oxide film of 100 nm thick was further formed as an insulating layer by thermal oxidation.

Next, the surface of the silicon oxide film was exposed to nitrogen plasma in a plasma reactor to activate the surface. This surface and the surface of a second silicon wafer separately prepared were face to face brought into contact, followed by heat treatment at 600° C. for 3 hours to effect bonding.

The composite member thus obtained was suction-attracted to a separation stage having a circular hole little smaller than the wafer size to cause the wafer to bend, whereby the stress was concentrated. In this state, a water jet was applied to the side surface of the bonded wafers (composite member) similarly to the manner shown in FIG. 12D as in Example 2, to enlarge the stress, whereupon it was separated flatly in an unevenness of about 500 nm at the interface between the porous layer having a high porosity and the porous layer having a low porosity.

As the result, the silicon oxide film, the epitaxial silicon layer and a part of the porous a silicon layer which were originally formed on the first silicon wafer surface were transferred to the second wafer side. On the first wafer, only the porous silicon having a high porosity remained.

Thereafter, the porous silicon layer transferred onto the second wafer was selectively etched with a mixture solution containing hydrofluoric acid with an HF concentration of 49% by weight, hydrogen peroxide water with an $H_2O_2$ concentration of 30% by weight and water; the solution being used with stirring. The single-crystal silicon remained without being etched, thus a single-crystal silicon thin film having a thickness of 0.2 μm was formable on the silicon oxide film.

The thin film was further subjected to heat treatment at 1,100° C. for 1 hour in an atmosphere of hydrogen to make its surface smooth.

EXAMPLE 4

A p-type first single-crystal silicon wafer with a resistivity of 0.01 Ω·cm was subjected to two-stage anodization in an HF solution to form a double-layered porous layer. Anodization conditions were as follows:
First Stage
Current density: 7 mA·cm$^{-2}$
Anodizing solution: $HF:H_2O:C_2H_5OH=1:1:1$
Time: 5 minutes
Thickness of first porous silicon layer: 4.5 μm
Second Stage
Current density: 30 mA·cm$^{-2}$
Anodizing solution: $HF:H_2O:C_2H_5OH=1:1:1$
Time: 10 seconds
Thickness of second porous silicon layer: 0.2 μm The substrate thus treated was subjected to hydrogen baking of its porous silicon layer without thermal oxidation of pore inner-wall surfaces of the porous silicon. Thereafter, single-crystal silicon was epitaxially grown on the porous layer by CVD in a thickness of 0.3 μm. Growth conditions were as follows:
Source gases: $SiH_2Cl_2/H_2$
Gas flow rate: 0.5/180 l/min.
Gas pressure: 80 Torr (about $1.06 \times 10^4$ Pa)
Temperature: 950° C.
Growth rate: 0.3 μm/min.

The surface of this epitaxial silicon layer was subjected to thermal oxidation to further form a silicon oxide film of 100 nm thick as an insulating layer.

Next, the surface of the silicon oxide film was exposed to nitrogen plasma in a plasma reactor to activate the surface. This surface and the surface of a second silicon wafer separately prepared were face to face brought into contact, followed by heat treatment at 600° C. for 3 hours to effect bonding.

The bonded substrates (composite member) thus formed was axially held at its center from the both sides, and a water jet was applied to the side surface of the substrate while rotating it about the wafer center as rotational center. Here, 0° C. water was poured on the first-wafer surface side and the second-wafer surface side, i.e., the both surfaces of the composite member to cool it, and at the same time hot pure water heated to a temperature of 98° C. was jetted to the side surface. This caused a strain due to temperature difference, in the composite member between the water-jetted portion and the portions other than the water-jetted portion, so that the composite member was separated flatly in an unevenness of about 500 nm at the vicinity of the interface between the porous layer having a high porosity and the porous layer having a low porosity.

As the result, the silicon oxide film, the epitaxial silicon layer and a part of the porous silicon layer which were originally formed on the first silicon wafer surface were transferred to the second wafer side. On the first wafer, only the porous silicon having a high porosity remained.

Thereafter, the porous silicon layer transferred onto the second wafer was selectively etched with a mixture solution containing hydrofluoric acid with an HF concentration of 49% by weight, hydrogen peroxide water with an $H_2O_2$ concentration of 30% by weight and water; the solution being used with stirring. The single-crystal silicon remained without being etched, thus a single-crystal silicon thin film having a thickness of 0.2 μm was formable on the silicon oxide film.

The thin film was further subjected to heat treatment at 1,100° C. for 1 hour in an atmosphere of hydrogen to make its surface smooth.

EXAMPLE 5

An example for producing a thin-film crystal silicon photovoltaic device is shown below with reference to FIGS. 13A to 13G.

As the first substrate, a [111]-plane p$^+$-type silicon wafer 301 was prepared. This wafer was immersed in a mixture solution of hydrofluoric acid and isopropyl alcohol, where this wafer 301 was set as a positive electrode and a platinum plate as a negative electrode to effect anodization to form a separation layer consisting of a high-porosity porous layer 302 and a low-porosity porous layer 303 (see FIGS. 13A and 13B).

The porous layers were formed under the same conditions as those in Example 1.

The lattice strain of the silicon wafer on the surface of which the porous layers were formed was analyzed by Raman spectroscopy, to ascertain that a strong (tensile) stress stood applied to the interior of the porous layer 302.

On the surface of the porous layer 303, a p-type thin-film single-crystal silicon layer 304 of about 30 μm thick was formed by epitaxial growth in a liquid-phase growth apparatus. The liquid-phase growth apparatus is so set up that metallic indium can be heated to and melted at a desired temperature in a crucible made of quartz glass, placed in a quartz glass hermetically closed reactor. First, p-type polycrystalline silicon was dissolved to liquid indium kept at 950° C., until the silicon was saturated with the indium, to obtain a melt. Subsequently, the silicon wafer having the porous layers formed was immersed in the melt, and the melt was cooled at a rate of −1° C./minute. With the cooling, the silicon that did not dissolve completely in the melt began to deposit on the surface of the porous layer 303, and the p-type silicon layer 304 was epitaxially grown. On the surface of the p-type thin-film single-crystal silicon layer 304 thus formed, an n$^+$-type silicon layer 305 of about 0.2 μm thick was further epitaxially grown, using a liquid-phase growth apparatus making use of a melt prepared by dissolving phosphorus-doped n$^+$-type silicon in tin (see FIG. 13C).

On the surface of this layer 305, a silicon nitride layer of about 70 nm thick was deposited as a anti-reflection layer 306 by sputtering. Through-holes were further formed on this surface, and a grid electrode 307 having the shape of comb teeth was formed by screen printing followed by baking (see FIG. 13D).

Subsequently, as a second substrate, a polyethylene terephthalate (PET) film of 0.2 mm thick was bonded onto the grid electrode with ethylene vinyl acetate (EVA). An end of this sheet member was fastened to a peeling roller 310 of 100 mm in diameter and was wound up from its edge side, whereupon a crack was generated in the porous layer 302 along the interface between the porous layers 302 and 303 at which the stress had been concentrated and a thin-film crystal photovoltaic device 311 was peeled from the wafer 301 (see FIG. 13E). Onto the back of this device, a stainless steel sheet back electrode 312 was bonded with a conductive adhesive 313 composed of copper as a main component. Here, small holes were previously made in the PET film, and the holes were filled with a conductive adhesive to form a lead-out electrode 314 to ensure electrical conduction to the grid electrode (see FIG. 13F). In this state, its conversion efficiency was measured with a solar simulator adjusted to AM 1.5 to find that the conversion efficiency was 15%.

Wafer 315 from which the device 311 had been peeled was immersed in an aqueous 1% sodium hydroxide solution to remove the residual porous layer remaining on the surface. In the method of the present invention, the porous layer 302 was so thin that the etching time taken to remove the residue was short. Also, the surface of the wafer 301 became a perfect mirror surface after the etching (see FIG. 13G). Using this wafer 301, the steps described above may be repeated, thus a photovoltic device having a conversion efficiency equal to the first one can be produced and the wafer can be used repeatedly.

EXAMPLE 6

A [111]-plane p$^+$-type silicon wafer as the first substrate was prepared, and this was subjected to two-stage anodization under the following conditions to form two porous layers.
First Stage
Current density: 7 mA·cm$^{-2}$
Anodizing solution: HF:H$_2$O:C$_2$H$_5$OH=1:1:1
Time: 5 minutes
Thickness of first porous silicon layer: 4.5 μm
Second Stage
Current density: 30 mA cm$^{-2}$
Anodizing solution: HF:H$_2$O:C$_2$H$_5$OH=1:1:1
Time: 10 seconds
Thickness of second porous silicon layer: 0.2 μm The wafer at the surface of which the porous layers was thus formed was processed in the same manner as in Example 5 to form a p-type thin-film single-crystal silicon layer of about 30 μm thick and an n$^+$-type silicon layer of about 0.2 μm thick by liquid-phase epitaxial growth.

Using a temporary-bonding adhesive Crystal Bond 555, available from Alecom Products Co., the n-type silicon layer was bonded to a PET film with this adhesive.

In order to produce the stress concentratedly at the interface of the two porous layers, a holder on which the above wafer was set was heated to heat the back of the wafer to 50° C. and at the same time −50° C. cold air was sprayed to the PET film surface.

The p-type and n-type silicon layers having been bonded to the PET film were peeled while winding up the PET film with a roller.

The surface of the porous layer exposed as a result of the peeling, lying on the p-type and n-type silicon layers, was bonded to a stainless steel substrate prepared separately with a conductive adhesive composed of copper as a main component, followed by provisional baking at 100° C. This was immersed in about 100° C. hot water to melt the temporary-bonding adhesive and the PET film was peeled from the silicon layer.

The conductive adhesive was baked at 300° C. to cause it to cure to enhance the bonding strength between the stainless steel substrate and the silicon layer.

An antireflection layer and a grid electrode were formed on the surface of the p-type silicon layer exposed as a result of the peeling of the PET film. Thus, a thin-film photovoltaic device was obtained.

What is claimed is:

1. A method of separating a composite member, comprising the steps of;

forming on a surface of a first substrate a first porous layer and a second porous layer having a higher porosity than the first porous layer, said first and second porous layers being in the single-crystalline state;

oxidizing the first and the second porous layers to form oxide films on pore inner-wall surfaces of the first porous layer and make the second porous layer amorphous such that the insides of the pore walls of the first porous layer remain in the single-crystalline state and the entirety of the pore walls of the second porous layer are amorphous;

forming a non-porous layer on a layer surface of the first porous layer;

bonding the non-porous layer to a second substrate to form a composite member having a separation layer internally; and causing a crack in the separation layer to separate the composite member.

2. A process for producing a thin film of a non-porous layer on a second substrate comprising: forming and separating a composite member according to claim 1 and recovering the non-porous layer on the second substrate.

* * * * *